United States Patent [19]

Mimasaka

[11] Patent Number: 4,998,021

[45] Date of Patent: Mar. 5, 1991

[54] METHOD OF DETECTING AN END POINT OF SURFACE TREATMENT

[75] Inventor: Masahiro Mimasaka, Kyoto, Japan

[73] Assignee: Dainippon Screen Mfg. Co., Ltd., Japan

[21] Appl. No.: 438,668

[22] Filed: Nov. 17, 1989

[30] Foreign Application Priority Data

Nov. 18, 1988 [JP] Japan .............................. 63-293201

[51] Int. Cl.$^5$ ..................... G01N 21/86; G01B 11/02; H01L 21/306
[52] U.S. Cl. ................................. 250/560; 356/357; 156/626
[58] Field of Search ............... 250/560; 356/357, 382, 356/369; 156/626

[56] References Cited

U.S. PATENT DOCUMENTS

| | | | |
|---|---|---|---|
| 3,612,692 | 10/1971 | Kruppa et al. | 356/357 |
| 4,462,860 | 7/1984 | Szmanda | 356/382 |
| 4,611,919 | 9/1986 | Brooks, Jr. et al. | 356/357 |
| 4,618,262 | 10/1986 | Maydan et al. | 356/357 |
| 4,838,694 | 6/1989 | Betz et al. | 356/357 |

FOREIGN PATENT DOCUMENTS

83/04320 12/1983 PCT Int'l Appl. .

*Primary Examiner*—David C. Nelms
*Assistant Examiner*—Michael Messinger
*Attorney, Agent, or Firm*—Ostrolenk, Faber, Gerb & Soffen

[57] ABSTRACT

A method of detecting an end point of surface treatment of a wafer includes the steps of: projecting coherent light onto an upper surface of the wafer provided with a layer to be treated; receiving superposed light caused by interference of light reflected on a surface of the layer to be treated and on the other surface thereof and converting it to a photoelectric signal; sampling the photoelectric signal; detecting a first point where a variation range caused by the interference in the sampled data becomes smaller than a predetermined value; detecting a second point where an extreme value of the variation of the photoelectric signal caused by the interference occurs prior to the first point; and determining the end point of treatment by prescribed calculation using the second point as a reference point. The detection of the first point may be incorrect depending on the detection conditions. However, the second point prior to the first point is detected in a relatively stable manner irrespective of the detecting conditions. Thus, since the end point of treatment is determined by the prescribed calculation using the second point as a reference point, the end point of treatment is detected correctly and with good repeatability.

15 Claims, 4 Drawing Sheets

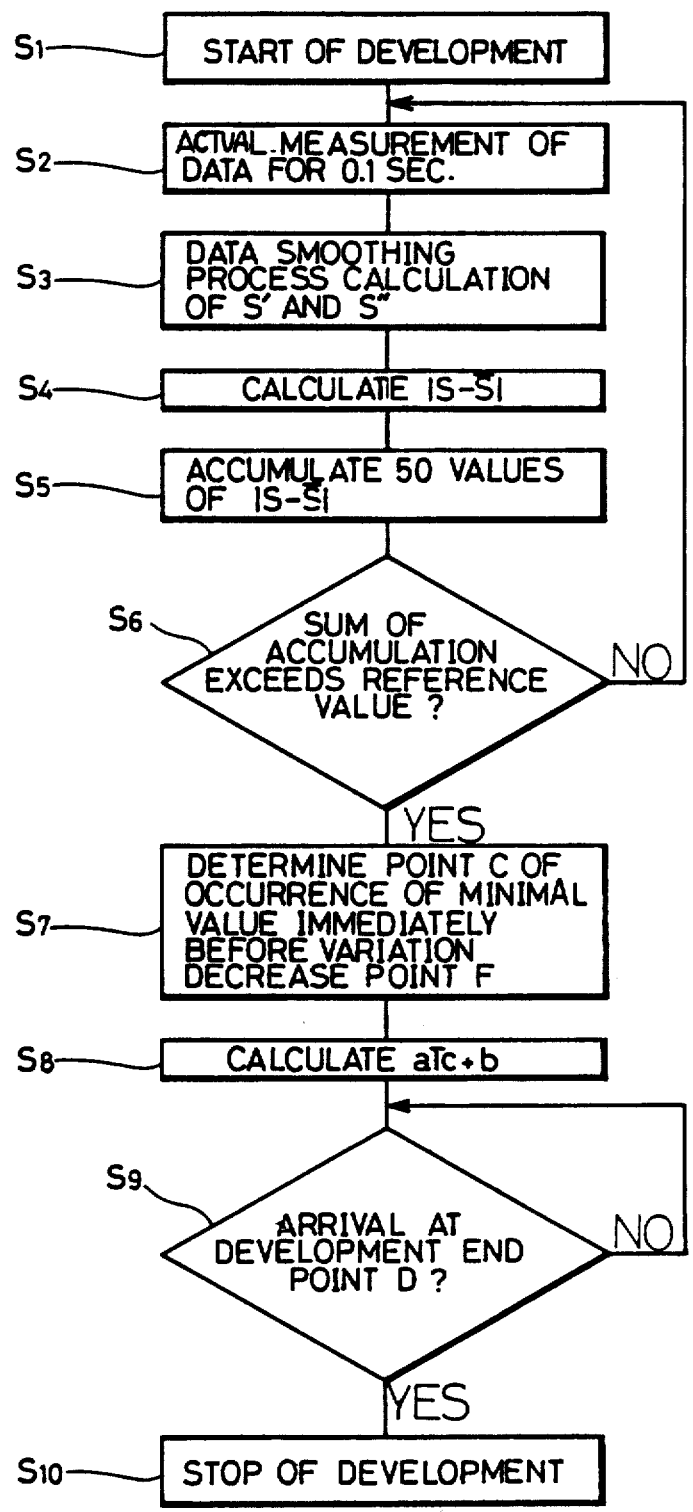

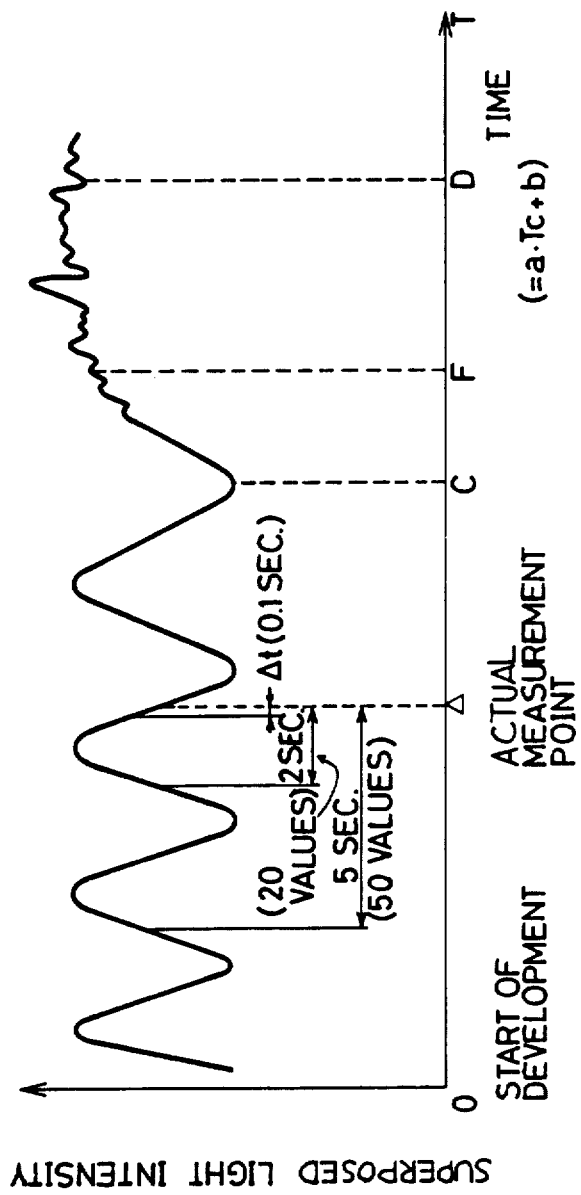

METHOD OF DETECTING AN END POINT OF SURFACE TREATMENT

BACKGROUND OF THE INVENTION

1. Field of the Invention

The present invention relates generally to methods of manufacturing miniaturized devices such as semiconductor wafers (referred to hereinafter as wafers) and, particularly, it relates to a method for detecting optically an end point of treatment of a layer formed on a surface of a wafer when the layer is treated while being supplied with a treatment solution.

2. Description of the Related Art

An example of the art of this type is disclosed in Japanese Patent Laying-Open No. 62-63431, which is a method of optically detecting an end point of developing a photoresist film. This method utilizes interference of light.

Referring to FIG. 1, the conventional end point detecting method will be described. A photoresist film 2 having a thickness d is applied to a wafer 1. The photoresist film 2 is exposed according to a circuit pattern. Coherent light (generally, laser light) L falls substantially vertically on a surface of the photoresist film 2 from above. A part of the light L is reflected on the surface of the photoresist film 2. Another part of the light L passes through the photoresist film 2, reaches the interface of the photoresist film 2 and the wafer 1 and is reflected thereon.

The light reflected on the surface of the photoresist film 2 is represented as light La. The light reflected on the interface of the photoresist film 2 and the substrate 1 is represented as light Lb. The light La and the light Lb are originally parts of the same light. Accordingly, the light La and the light Lb are able to interfere with each other and the interference wave changes dependent on the optical path difference $\Delta l$ of the lights La and Lb. The optical path difference $\Delta l$ changes when a developing solution is supplied to the photoresist film 2. This is because the thickness d of the photoresist film 2 decreases as the development by the developing solution proceeds.

When observed at a fixed point P on the optical paths of the reflected lights La and Lb, the intensity of the superposed light varies cyclically as a function of the film thickness. Consequently, the change of the thickness d of the photoresist film 2 can be detected by the variation of the intensity of the superposed light at the point P.

As the development proceeds, the thickness d of the photoresist film 2 decreases in pattern openings of the film 2 (where the photoresist is to be removed by the development). The intensity of the superposed light at the point P varies as the film thickness d decreases. When the photoresist film 2 is substantially removed to cause the openings to be penetrated, the intensity of the superposed light due to the decrease of the film thickness does not vary.

It is to be noted that even if the intensity of the superposed light due to the decrease of the film thickness ceases to vary, the intensity change of the superposed light at the point P continues, though slightly. This is because the measured value does not precisely represent the intensity of the superposed light only, due to various factors such as external disturbances received by the means for measuring the intensity of the superposed light. FIG. 2 shows such variations of the intensity of the superposed light at the point P.

Even after the decrease of the film thickness is ended, additional development is carried out for a prescribed amount of time in order to completely carry out the development. The period for the additional development needs to be accurately defined in order to carry out the development with good repeatability and with high efficiency. More specifically, if this period is too short, the development is insufficiently done. On the other hand, if this period is too long, excess development occurs and the efficiency of work is lowered.

Referring to FIG. 2, according to the conventional method, the point F where the variation of the light intensity becomes small (this point being hereinafter referred to as the variation decrease point) is used as a reference point for detecting an end point D of development. The point D where a preset time $T_0$ of additional development has passed from the variation decrease point F is defined as the end point of development.

The method of detection of the variation decrease point F will be briefly described in the following. The intensity of the superposed light is measured every small unit of time. The difference between the presently measured and the previous values is obtained. Absolute values of the differences for 50 measurements for example are accumulated. The accumulated value is considered to represent the variation range of the intensity of the superposed light during the 50 measurements. The point where the result of the accumulation is smaller than a prescribed value is determined to be the variation decrease point F. Since this method is the same as a method of detection of a variation decrease point F used in an embodiment of the present invention, a detailed description thereof is set forth below.

The time $t_0$ of additional development is determined for example in the following manner. A plurality of simulation wafers of the same specification as that of a wafer subjected to an actual development treatment (a wafer to be treated) are prepared. A photoresist film is formed on each simulation wafer under the same conditions as those for the wafer to be actually treated, and exposure according to a circuit pattern as well as other treatment is effected. The development treatment is applied to the respective simulation wafers for different periods of time with other conditions being the same.

Data on the intensity change of superposed light due to interference in each simulation wafer is obtained. Developed patterns of the respective simulation wafers are observed and compared with each other, and the simulation substrate having the best result of the development is selected. The end point of development of the selected simulation wafer is assumed to be D'. An end point F' of change of the superposed light is evaluated from the data on the intensity of the superposed light due to interference in the selected wafer. Based on the equation of $F' + t_0' = D'$, the time $t_0'$ of additional development is calculated. The time $t_0'$ of additional development thus determined is also adopted in the actual development of a wafer to be treated.

However, the conventional method has the following problems. In determining the variation decrease point F, the degree of decrease in the variation of the intensity of the superposed light is empirically defined. Depending on the adapted value of the variation range for defining this point, the detection point of the variation decrease point F varies easily. In addition, the detected variation decrease point F is unstable due to errors in measurement. The variation decrease point F does not always accurately represent the point where the intensity of the superposed light ceases to vary due to the decrease of the film thickness.

Further, the superposed light behaves unstably when the photoresist is substantially removed in the pattern openings and the photoresist film 2 is penetrated. It is fundamentally difficult to correctly detect the end point of the development treatment based on decrease of the intensity variation of the superposed light. Consequently, according to conventional methods, the end point D of the development is often incorrectly detected. This results in deterioration of the repeatability of the development treatment and lowering of the efficiency of work.

SUMMARY OF THE INVENTION

The present invention has been accomplished to solve the above-described problems and it is an object of the present invention to provide a method of detecting an end point of treatment, in which the end point of treatment can be detected with good repeatability.

Another object of the present invention is to provide a method of detecting an end point of treatment in which the end point of treatment can be detected with good repeatability and accuracy.

According to the present invention, a method of detecting an end point of treatment includes the steps of: applying coherent light to a main surface to a wafer having a layer to be treated formed in advance on the main surface, parts of the coherent light being reflected on the surface of the layer to be treated and on other surface nearer to the main surface of the wafer than the layer to be treated, interfering with each other to form superposed light; receiving the superposed light by the light receiving means and converting it to a photoelectric signal; sampling the photoelectric signal; detecting a first point where a variation range due to the interference of the sampled data becomes smaller than a predetermined value; detecting a second point where an extreme value of the variation takes place, prior to the first point; and determining an end point of treatment by using the second point as a reference point.

The first point may vary depending on the predetermined value, or an error in measurement. However, the second point exists during a period where a variation of the intensity of the superposed light due to interference of the light is stably observed. Consequently, it is easy to detect the second point and there is little error in the measurement. In addition, the film thickness at the second point is considered to be substantially the same in various treatment processes and the required time from the second point to the end point of treatment bringing about desired results of treatment is substantially constant. Accordingly, if the second point is detected and the end point of treatment is determined based on the detected second point, the treatment can be terminated at a suitable point and, thus, the surface treatment of the wafer can be carried out with good repeatability.

Thus, the present invention makes it possible to detect an end point of treatment with good repeatability.

According to a preferred embodiment of the present invention, the second point is the latest point prior to the first point where an extreme value of the change occurs. The film thickness of the layer to be treated at the second point is smaller than that in any other point where an extreme value takes place. Accordingly, the required time from the second point to a desired end point of treatment is shorter than the time from any other point where an extreme value takes place. The treatment rate during the above mentioned time changes little. If an end point of treatment is determined using the second point as a reference point, the treatment can be terminated with little error with respect to a desired end point of treatment. Thus, according to the present invention, the end point of treatment can be detected correctly.

According to another preferred embodiment of the invention, the step of determining the end point of treatment by using the second point as a reference point includes the step of determining the end point of treatment by multiplying the elapsed time from the start of treatment to the second point by a predetermined number.

The predetermined number is set to a number enabling the treatment to be carried out most suitably. Consequently, it becomes possible not only to carry out the treatment with good repeatability but also to detect the end point of treatment easily and correctly.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a flow chart of a program executed in a data processing portion.

FIG. 5 is a graph showing variations in intensity of superposed light according to a method of detecting an end point of treatment according to the present invention.

DESCRIPTION OF THE PREFERRED EMBODIMENTS

An embodiment of the present invention will be described with reference to the drawings. The present invention is applicable for example to development of a photoresist film or an etching process of a thin film. The following embodiment relates to an example of a method of detecting an end point of treatment in the case of developing a photoresist film.

Figure 3:
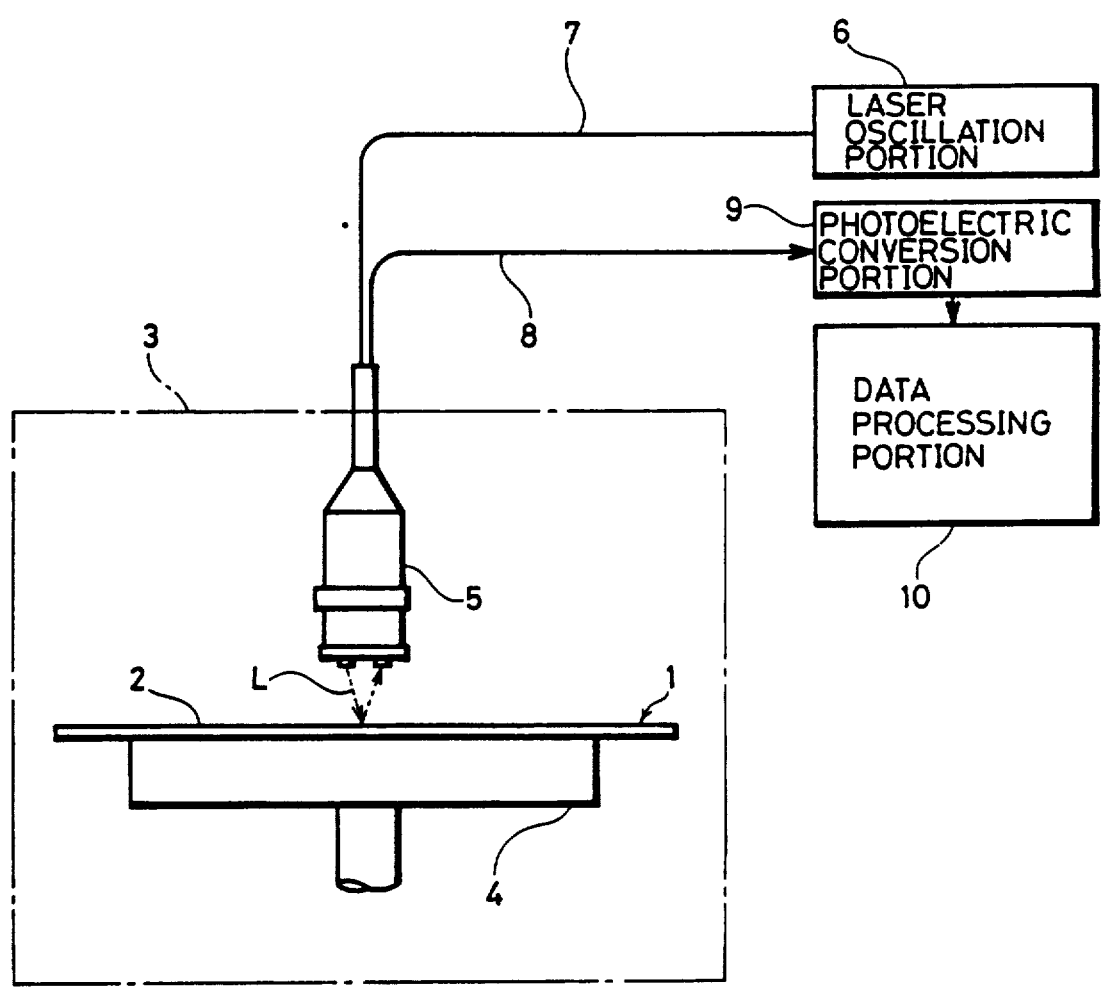
FIG. 3 is a block diagram of an apparatus for applying a method of detecting an end point of treatment according to the present invention.

Referring to FIG. 3, an apparatus used for applying the method according to the present invention comprises: a developing unit 3 for developing a wafer 1 having a photoresist film 2 subjected to exposure; a laser light oscillation portion 6 for oscillating laser light used for detection of an end point of treatment; a photoelectric conversion portion 9 for receiving the laser light applied to the wafer 1 and reflected thereon and outputting a photoelectric signal; and a data processing portion 10 for sampling and processing the photoelectric signal and determining an end point of treatment.

The developing unit 3 comprises: a spin chuck 4 for contact-supporting, for example, suction-holding the lower surface of the wafer 1 in contact; an optical fiber probe 5 located over the upper surface of the substrate 1 with a suitable spacing therefrom and connected to the laser light oscillation portion 6 through a projection fiber cord 7 and to the photoelectric conversion portion 9 through a light receiving fiber cord 8; and a nozzle, not shown, for supplying a developing solution to the upper surface. The optical fiber probe 5 emits laser light L substantially at right angles with the upper surface of the substrate 1.

Referring to FIG. 3, a method of detecting an end point of surface treatment of a wafer according to the present invention will be described. The substrate 1 is subjected to preliminary treatment such as coating of a photoresist film 2 and an exposure process. The substrate 1 is contact-held, for example, suction-held by the spin chuck 4. The wafer 1 receives drops of the developing solution from a nozzle (not shown) and is developed, while being horizontally rotated by the spin chuck 4. The portions not exposed (or the exposed portions) of the photoresist film 2 are processed by the developing solution and the thickness thereof is gradually decreased.

The laser light oscillation portion 6 emits laser light for detecting an end point of treatment. The laser light is transmitted from the laser light oscillation portion 6 to the optical fiber probe 5 through the projection fiber cord 7. The optical fiber probe 5 projects the laser light L to a portion of the photoresist film 2, to be removed by the development, on the wafer 1. The laser light L is projected substantially vertically to the upper surface of the wafer 1.

Figure 1:
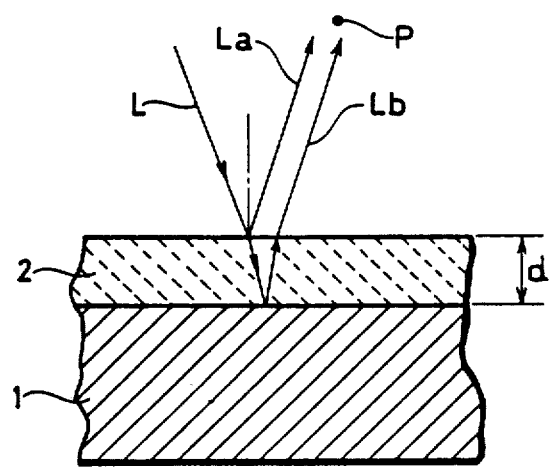
FIG. 1 is a sectional view of a wafer and a photoresist layer for explaining a principle of light interference.
Figure 2:
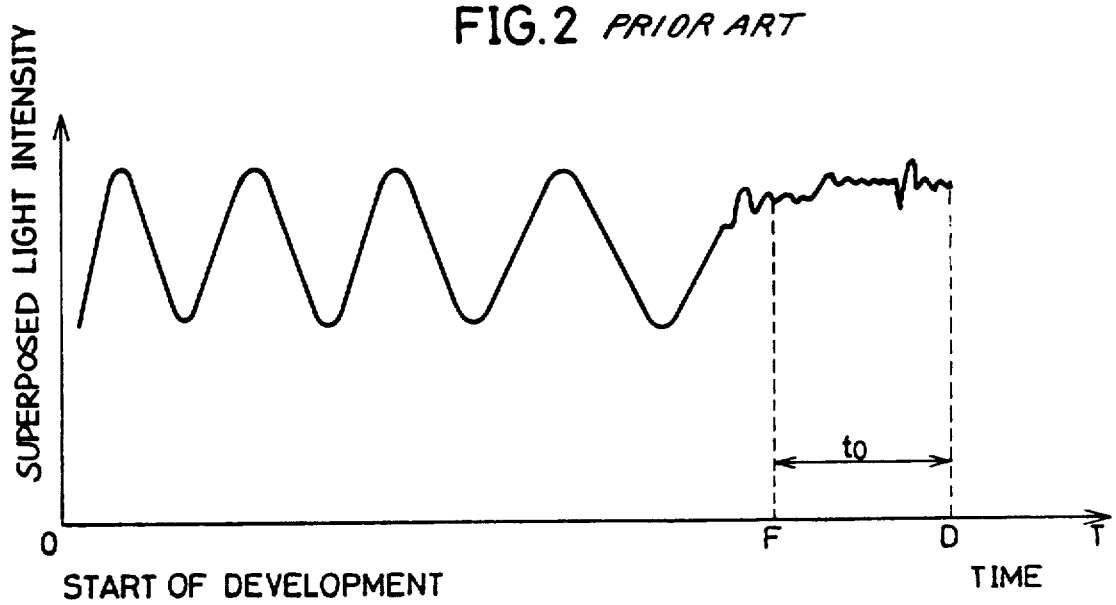
FIG. 2 is a graph showing variations in measured intensity of superposed light according to a conventional method.

Referring again to FIG. 1, the emitted laser light L is reflected on the surface of the photoresist film 2 and on the interface between the wafer 1 and the photoresist film 2, as described previously. The reflected laser lights interfere with each other. The superposed light due to the interference enters the optical fiber probe 5. The superposed light is transmitted to the photoelectric conversion portion 9 through the light receiving fiber cord 8.

The superposed photoelectric is converted to a light signal in the photoelectric conversion portion 9. The photoelectric signal is applied to the data processing portion 10. The data processing portion 10 comprises a microcomputer and so on. The data processing portion 10 processes the inputted electric signal and determines an end point of development according to a program for executing the following procedures.

Referring to FIGS. 4 and 5, the data processing portion 10 performs the below described processing. The data processing portion 10 starts operation simultaneously with a start of a development process in step S1. In step S2, a value of intensity of the superposed light is measured for each small unit time $\Delta t_1$ (e.g., 0.1 sec). The data is successively stored in a memory (not shown) in the data processing portion 10.

In step S3, the measured data are smoothed so that the dispersion thereof may be corrected. The smoothing is a process for offsetting the dispersion caused by errors and it is carried out according to an equation as indicated below.

$$S(t) = \sum_{i=-5}^{5} D(t - i\Delta t_1)/11 \quad (1)$$

where S(t) represents smoothed data at time t and D(t) represents a value measured at time t. As a result of the processing according to the equation (1), a simple mean of data in a prescribed time (10 $\Delta t_1$) is obtained. Needless to say, the prescribed time is not limited to 10 $\Delta t_1$; it may be any number insofar as the errors can be corrected sufficiently. The equation for the smoothing is not limited to the equation (1), and the coefficients of the respective terms in the equation (1) may be binomial distribution coefficients for example.

In step S3, calculation is also performed to obtain a primary difference S' of the smoothed data S and a secondary difference S" at intervals of small unit times $\Delta t_2$ (e.g., 0.1 sec).

In step S4, calculation is performed to obtain an absolute value $|S-\bar{S}|$ of a difference between the smoothed data S at an actual measurement point and the smoothed data $\bar{S}$ two seconds before it, for example.

In step S5, 50 such absolute values $|S-\bar{S}|$ of the differences are accumulated. In step S6, it is determined whether the result of the accumulation is a predetermined value or less. If YES, the point is defined as the variation decrease point F (refer to FIG. 5). If NO, the processing flow returns to step S2.

In step S7, the data S' and S" stored in the memory are retrieved in a direction opposite to the proceeding of the time from the variation decrease point F which is assumed as the start point. A point is obtained which appears first when the condition is satisfied that the sign of the primary difference S' changes from plus to minus and that the value of S" at the change point becomes greater than zero. The above mentioned point thus obtained is defined as a point C of occurrence of a minimal value immediately before the variation decrease point F (refer to FIG. 4).

Although the measured data are discrete data, real light intensity is considered to be continuous data. The continuous data is considered to be represented by one function. The above-described processing can be regarded as an operation for detecting the minimal value immediately before the variation decrease point F of the curve represented by this function. More specifically, at this point C, a derivative of first order of this function is O and derivative of second order of this function is positive. The condition that the secondary difference S" is a predetermined value or more is set for the purpose of excluding a trivial minimal point caused by noise.

In step S8, the elapsed time Tc from the start of development to the point C is determined. Tc is substituted into the following equation.

$$D = a \cdot Tc + b \quad (2)$$

From the equation (2), the end point D of development is determined.

In the equation (2), the constants a and b are preset in the following manner. A plurality of simulation wafers of the same specification as that of a wafer subjected to actual development treatment (i.e., a wafer to be treated) are prepared. A photoresist film is formed on each of the simulation wafers under the same conditions as those for the wafer to be treated, and exposure for circuit patterning and other processes are effected. Development treatment is applied to the respective simulation wafers for different amounts of time. The other conditions are the same for all the simulation wafers.

On this occasion, superposed light caused by the interference is observed in the same manner as described above. Data are obtained for the respective simulation wafers on the intensity variation of the superposed light with time. The pattern after the development are observed and compared with each other and the simulation wafer having the best result of the development is selected. A stop point of development of the selected simulation wafer is defined as D". Based on the data on the intensity variation of the superposed light of that wafer, the latest point C" where a minimal value takes place is evaluated. The constant a is calculated based on the following equation (3).

$$D'' = a \cdot Tc'' \quad (3)$$

The equation (3) is obtained by substituting b=0 in equation (1).

The constant b is added to slightly change the end point of development forward or backward. At the time of normal development, b=0 is set. If conditions of various processes such as formation of a photoresist film of a wafer to be treated, exposure and development are slightly changed, b≠0 is applied. Thus, it becomes unnecessary to obtain again the constant a using a new simulation wafer.

For reference, specific values at respective points in the case of treating a UV positive-type resist by an alkaline developing solution are shown in the following. The time periods indicated below are the elapsed time from the start of development to the respective points, unless otherwise indicated.

```
C = 15 to 25 sec
time between C and F: about 5 sec
D = 40 to 60 sec
a = 2.4
b = 0
```

It is to be added that the exposed portions, in the case of positive-type resist, become soluble in alkali. Accordingly, only the exposed portions are removed from the wafer by using an alkaline developing solution containing as a main constituent an organic alkali compound such as tetramethylammonium hydroxide or choline.

In step S9, it is determined whether or not the process has reached the point D from the start of development. This step is repeated until YES. When the condition is met (YES), the development is stopped.

The end point of development is thus determined, which brings about meritorious effects as described below. The results of detection of the variation decrease point F unavoidably vary depending on a reference value as in the conventional method. On the other hand, according to the method of the present invention, even if the variation decrease point F changes to some extent, the point C obtained from the point F is defined relatively correctly. The development still proceeds at the point C. Since the value of the signal at the point C is a minimal value, the thickness of the photoresist film at this time is a substantially constant thickness defined by the wavelength of the laser light. In addition, the thickness is sufficiently small, which makes it unnecessary to consider a possibility of large change in the treatment rate thereafter.

Accordingly, the succeeding development treatment rate after the point C is always substantially the same throughout a plurality of treatment processes, and the required periods until the completion of the development re considered to be equal to each other. As a result, a point after a predetermined time from the point C is defined as an end point of treatment, whereby development can be terminated with high precision and with good repeatability in a plurality of treatment processes.

In the above described embodiment, the point C (used as a reference point for calculation of the end point D) of development is defined as a point of occurrence of the minimal value immediately before the variation decrease point F. However, the present invention is not limited thereto and the point C can be used as a point of occurrence of the maximal value immediately before the variation decrease point F. However, in this case, it is necessary to modify the processing in step S7 in the following manner.

In the modified step S7, the primary difference S' and the secondary difference S" are retrieved in the direction opposite to the proceeding of the time using the variation decrease point F as a start point. The point where the following condition is satisfied is detected as the point C, the condition being that the sign of the primary difference S' changes from minus to plus and that the secondary difference S" at that point becomes or or less than zero. Thus, the maximal value immediately before the variation decrease point F is detected.

However, in general, if there is no light transmitting layer under the layer to be treated, it is practical to detect the minimal value immediately before the variation decrease point F as in the above-described embodiment. The reasons for these are as follows.

Although a specified explanation is not given, if there is no light transmitting layer under the layer to be treated as described above, the extreme value of the data of the superposed light appearing immediately before the layer to be treated is penetrated is always the minimal value. In any preceding point where an extreme value occurs, the thickness of the film to be treated is larger than that at the point of the latest minimal value. Accordingly, using the point of the latest minimal value as a reference, there is the least error compared with the cases where any other point of an extreme value is adopted as a reference point and the end point of treatment can be determined more accurately.

However, if there is a second layer which transmits light under the layer to be treated, the above-described reasoning does not always apply. This is because the extreme value appearing latest in such a case may be the maximal value depending on various factors such as film thicknesses or refractive indexes of the second layer and the layer to be treated. In that case, it is necessary to determine which is to be adopted, the maximal value or the minimal value by simulation or preliminary calculation.

Needless to say, the point where an extreme value occurs other than the point immediately before the variation decrease point F can be used as a reference point as described above. However, in such cases, a slightly larger error might occur compared with the case of using the point immediately before the point F.

The calculation equation for obtaining the end point D of development from the point C is not limited to the above-described equation (2). It goes without saying that any suitably set equation can be used. However, the equation (2) is practical since the calculation is simple and the number of parameters to be set is small.

In the above-described embodiment, the wafer 1 is supplied with a developing solution while being held and horizontally rotated by the spin chuck 4, and an end point of treatment is detected. However, the relation in time between the supply of the developing solution and the rotation of the wafer, in putting the present invention into practice, is not limited to that in the above-described embodiment. For example, a developing solution may be supplied when the rotation of the wafer is stopped, and thereafter the wafer may be spun to be dry of the developing solution.

In addition, the relation in time between the detection of the end point of development of the photoresist and the rotation of the wafer is not limited to that in the above-described embodiment. More specifically, although the detection of the end point of development according to the above described embodiment is carried out during the rotation of the wafer, it may be carried out when the rotation of the wafer is stopped.

Further, as described previously, the techniques according to the present invention are widely applicable to surface treatment of miniaturized devices and so on, such as etching of thin films, in addition to the above-described development work of photoresist.

Although the present invention has been described and illustrated in detail, it is clearly understood that the same is by way of illustration and example only and is not to be taken by way of limitation. The spirit and scope of the present invention should be limited only by the terms of the appended claims.

What is claimed is:

1. A method of accurately determining an end point of treatment, comprising the steps of:
   (A) holding a wafer, said wafer having a main surface and a layer to be treated, said lever being formed in advance on said main surface;
   (B) supplying treatment solution on said layer and thereby decreasing the thickness of said layer;
   (C) projecting coherent light on said lever, a part of said coherent light being reflected on a surface of said layer, another part of said coherent light being reflected on said main surface, and said parts of said coherent light interfering with each other to form superposed light, the intensity of said superposed light having a variation which is cyclical between extreme values as the thickness of said lever decreases and which then becomes smaller than a certain value;
   (D) receiving said superposed light and outputting a photoelectric signal, the photoelectric signal being representative of the intensity of said superposed light such that said photoelectric signal has a variation which is cyclical between extreme values and which then becomes smaller than a predetermined value;
   (E) sampling said photoelectric signal and thereby obtaining sampled data;
   (F) detecting a first point of time at which the variation of said photoelectric signal becomes smaller than said predetermined value;
   (G) thereafter determining a second point of time corresponding to the occurrence of the last of said extreme values of said photoelectric signal; and
   (H) determining said end point of treatment by prescribed calculation using said second point as a reference point.

2. A method of determining an end point of treatment in accordance with claim 1, wherein
   said last extreme value is a maximum value.

3. A method of determining an end point of treatment in accordance with claim 1, wherein
   said step (H) includes the step of
   (I) determining said end point of treatment by multiplying time from a start of treatment to said second point by a predetermined number.

4. A method of determining an end point of treatment in accordance with claim 3, wherein
   said step (H) further includes the step of
   (J) determining a new end point of treatment by changing said determined end point of treatment forward or backward by a predetermined period.

5. A method of determining an end point of treatment in accordance with claim 1, wherein
   said last extreme value is a minimal value.

6. A method of determining an end point of treatment in accordance with claim 1, further comprising the step of
   smoothing said sampled data.

7. A method of determining an end point of treatment in accordance with claim 6, further comprising the step of
   calculating a primary difference for each predetermined unit time with respect to said smoothed data.

8. A method of determining an end point of treatment in accordance with claim 7, further comprising the step of
   calculating a secondary difference for each said unit time with respect to said smoothed data.

9. A method of determining an end point of treatment in accordance with claim 8, wherein
   said step (G) further includes the step of
   detecting a point prior to said first point, where the sign of said primary difference changes for the last time from a first sign to a second sign different from said first sign and an absolute value of said secondary difference becomes a predetermined value or more.

10. A method of determining an end point of treatment in accordance with claim 9, wherein
    said first sign is minus and said second sign is plus.

11. A method of determining an end point of treatment in accordance with claim 10, wherein
    said said secondary difference is a positive value.

12. A method of determining an end point of treatment in accordance with claim 9, wherein
    said first sign is plus and said second sign is minus.

13. A method of determining an end point of treatment in accordance with claim 12, wherein
    said second difference is a negative value.

14. A method of determining an end point of treatment in accordance with claim 1, wherein
    said layer to be treated is a photoresist layer.

15. A method of determining an end point of treatment in accordance with claim 14, wherein
    said treatment solution is for developing said photoresist layer.

* * * * *